(12) United States Patent
Scollay et al.

(10) Patent No.: US 8,992,153 B2
(45) Date of Patent: Mar. 31, 2015

(54) SYSTEM AND METHOD FOR SUBSTRATE TRANSPORT

(75) Inventors: Stuart Scollay, San Jose, CA (US); Terry Bluck, Santa Clara, CA (US); Xiang Chen, Singapore (SG)

(73) Assignee: Intevac, Inc., Santa Clara, CA (US)

( * ) Notice: Subject to any disclaimer, the term of this patent is extended or adjusted under 35 U.S.C. 154(b) by 662 days.

(21) Appl. No.: 12/495,740

(22) Filed: Jun. 30, 2009

(65) Prior Publication Data
US 2009/0324369 A1    Dec. 31, 2009

Related U.S. Application Data

(60) Provisional application No. 61/077,067, filed on Jun. 30, 2008, provisional application No. 61/084,600, filed on Jul. 29, 2008.

(51) Int. Cl.
*H01L 21/677* (2006.01)
*H01L 21/67* (2006.01)
*H01L 21/673* (2006.01)

(52) U.S. Cl.
CPC .... *H01L 21/67173* (2013.01); *H01L 21/67313* (2013.01); *H01L 21/67775* (2013.01); *H01L 21/67781* (2013.01); *Y10S 414/14* (2013.01)
USPC .......................................... 414/217; 414/940

(58) Field of Classification Search
CPC ................... H01L 21/6719; H01L 21/67276; H01L 21/67769; H01L 21/67775; H01L 21/67736; H01L 21/67733; H01L 21/67173; H01L 21/67742; H01L 21/67745; H01L 21/67772; H01L 21/68707; H01L 21/67745; H01L 21/67781; H01L 21/67201; H01L 21/67766; H01L 21/67748; H01L 21/67778; H01L 21/67751; H01L 21/67161; B23Q 7/1426; B23Q 7/04; B23Q 7/048; B23Q 1/66; B21D 43/24; B23F 23/04; B23G 47/92; B65H 19/305; B25J 9/107; F26B 5/06; F26B 25/001; C23C 14/568; C23C 14/566; C23C 14/56; C23C 14/50; C23C 16/54

USPC .......... 204/298.25, 298.35; 118/719, 729, 50, 118/728; 156/345.31, 345.32; 414/222.01, 414/217, 217.1, 222.07, 222.08, 222.09, 414/222.12, 226.05, 937, 938, 939, 935, 414/222.06, 940

See application file for complete search history.

(56) References Cited

U.S. PATENT DOCUMENTS 3,492,215 A    1/1970    Contant
4,401,052 A    8/1983    Baron et al.
(Continued)

FOREIGN PATENT DOCUMENTS

CN    1845306 A    10/2006
CN    101174556 A    5/2008
(Continued)

OTHER PUBLICATIONS

European Search Report in European Application No. 09164187.8, dated Dec. 10, 2010.
(Continued)

*Primary Examiner* — Saul Rodriguez
*Assistant Examiner* — Glenn Myers
(74) *Attorney, Agent, or Firm* — Nixon Peabody LLP; Joseph Bach, Esq.

(57) ABSTRACT

Introduction of substrates into vacuum environment is accomplish by gradually reducing the number of substrates being transferred simultaneously as the clean and evacuated environment is progressed. Cassettes are maintained in clean atmospheric environment and do not enter the vacuum environment. Several vacuum locks are linearly staggered so as to introduce progressively higher level of vacuum environment. The number of substrates transported through this arrangement is a portion of the number of substrates present in each cassette. The staggered vacuum locks lead to a series of processing chambers, wherein a yet smaller number of substrates, e.g., one or two, are transported.

20 Claims, 7 Drawing Sheets

(56) References Cited

U.S. PATENT DOCUMENTS

| | | | |
|---|---|---|---|
| 4,902,934 A * | 2/1990 | Miyamura et al. | 315/111.21 |
| 5,215,420 A * | 6/1993 | Hughes et al. | 414/217 |
| 5,417,537 A * | 5/1995 | Miller | 414/217 |
| 5,439,575 A | 8/1995 | Thornton et al. | |
| 5,543,022 A * | 8/1996 | Nguyen et al. | 204/298.15 |
| 5,697,749 A * | 12/1997 | Iwabuchi et al. | 414/217 |
| 5,844,195 A | 12/1998 | Fairbairn et al. | |
| 5,846,328 A | 12/1998 | Aruga et al. | |
| 6,244,811 B1 * | 6/2001 | Kroeker et al. | 414/217 |
| 6,251,232 B1 * | 6/2001 | Aruga et al. | 204/192.32 |
| 6,270,306 B1 * | 8/2001 | Otwell et al. | 414/222.13 |
| 6,319,373 B2 * | 11/2001 | Takeyama et al. | 204/298.25 |
| 6,502,054 B1 * | 12/2002 | Mooring et al. | 702/150 |
| 6,682,343 B2 * | 1/2004 | Takahashi | 432/128 |
| 6,827,788 B2 * | 12/2004 | Takahashi | 118/719 |
| 6,852,194 B2 * | 2/2005 | Matsushita et al. | 156/345.32 |
| 6,919,001 B2 | 7/2005 | Fairbairn et al. | |
| 6,955,517 B2 * | 10/2005 | Nulman et al. | 414/222.01 |
| 6,970,770 B2 * | 11/2005 | Iljima et al. | 700/218 |
| 6,974,976 B2 | 12/2005 | Hollars | |
| 7,039,501 B2 * | 5/2006 | Freeman et al. | 700/258 |
| 7,198,447 B2 * | 4/2007 | Morimitsu et al. | 414/217 |
| 7,198,448 B2 * | 4/2007 | Ozawa et al. | 414/217 |
| 7,245,989 B2 * | 7/2007 | Hosek et al. | 700/245 |
| 7,407,358 B2 * | 8/2008 | Takahashi | 414/217 |
| 7,833,351 B2 * | 11/2010 | Webb et al. | 118/719 |
| 2002/0026984 A1 | 3/2002 | Marxer et al. | |
| 2002/0153578 A1 * | 10/2002 | Aggarwal et al. | 257/400 |
| 2003/0131458 A1 * | 7/2003 | Wang et al. | 29/25.01 |
| 2003/0211275 A1 | 11/2003 | Buitron et al. | |
| 2006/0096635 A1 | 5/2006 | Tuttle | |
| 2006/0105548 A1 * | 5/2006 | Kudo et al. | 438/476 |
| 2007/0283996 A1 | 12/2007 | Hachtmann et al. | |
| 2008/0053519 A1 | 3/2008 | Pearce et al. | |
| 2008/0115729 A1 | 5/2008 | Oda et al. | |
| 2008/0232948 A1 * | 9/2008 | van der Meulen et al. | 414/805 |
| 2008/0251120 A1 | 10/2008 | Malmstrom et al. | |
| 2008/0289953 A1 | 11/2008 | Hollars | |
| 2009/0194026 A1 * | 8/2009 | Burrows et al. | 118/719 |
| 2010/0024731 A1 | 2/2010 | Eristoff et al. | |

FOREIGN PATENT DOCUMENTS

| | | |
|---|---|---|
| CN | 101630634 A | 1/2010 |
| EP | 1526565 A2 | 4/2005 |
| EP | 2141739 A2 | 1/2010 |
| JP | 2004179567 A | 6/2004 |
| JP | 2010-62534 A | 3/2010 |
| WO | 2010/014761 A1 | 2/2010 |

OTHER PUBLICATIONS

"Spike RTA+ms annealing may delay need for metal gates," Solid State Technology—Technology News, Oct. 2007.

Rommel Noufi, et al., "High-Efficiency CdTe and CIGS Thin-Film Solar Cells: Highlights and Challenges," National Renewable Energy Laboratory, May 2006.

A. Compaan, et al., "Fabrication and Phyics of CdTe Devices by Sputtering," Final Report Mar. 1, 2005-Nov. 30, 2008, National Renewable Energy Laboratory, Apr. 2009.

International Search Report and Written Opinion in International Application No. PCT/US09/52167, mailed Sep. 15, 2009.

First Office Action in Chinese Patent Application No. 200910158447.0 dated May 2, 2013.

Geiger, F., et al., "The vapor pressure of Indium, Silver, Gallium, Copper, Tin, and Gold between 0.1 and 3.0 bar," International Journal of Thermophysics, Jul. 1987, pp. 425-436, vol. 8, No. 4, Springer Netherlands.

Sacks, R.N., et al., "Promising new valved source for Ga or In evaporation," Journal of Vacuum Science and Technology B, May/Jun. 2007, pp. 983-986, vol. 25, Issue No. 3, American Vacuum Society.

Office Action in U.S. Appl. No. 12/512,010 dated Dec. 13, 2012.
Office Action in U.S. Appl. No. 12/512,010 dated Jun. 27, 2013.
Office Action for U.S. Appl. No. 12/512,010 dated Nov. 19, 2014.

\* cited by examiner

SYSTEM AND METHOD FOR SUBSTRATE TRANSPORT

RELATED APPLICATIONS

This application claims priority benefit from U.S. provisional application Ser. Nos. 61/077,067 and 61/084,600, filed on Jun. 30, 2008 and Jul. 29, 2008, respectively, the entire disclosure of which is incorporated herein by reference.

BACKGROUND

1. Field

The subject invention relates to transporting of substrates for processing in a vacuum processing environment.

2. Related Art

Vacuum processing systems are used to fabricate hard-drive disks, semiconductor computer chips, solar panels, and the like, from substrates made of materials such as semiconductor wafers, glass, stainless steel, etc. Typically, the vacuum processing systems include several substrate chambers that perform various processes that modify the substrate by performing deposition, cleaning, etching, heating/cooling, etc., on the substrate The substrates are generally transported to the processing systems in cassettes holding several substrates in a clean atmospheric environment, and then the substrates are transported from the cassette, one by one, through a loadlock into the vacuum environment of the system.

Figure 1:
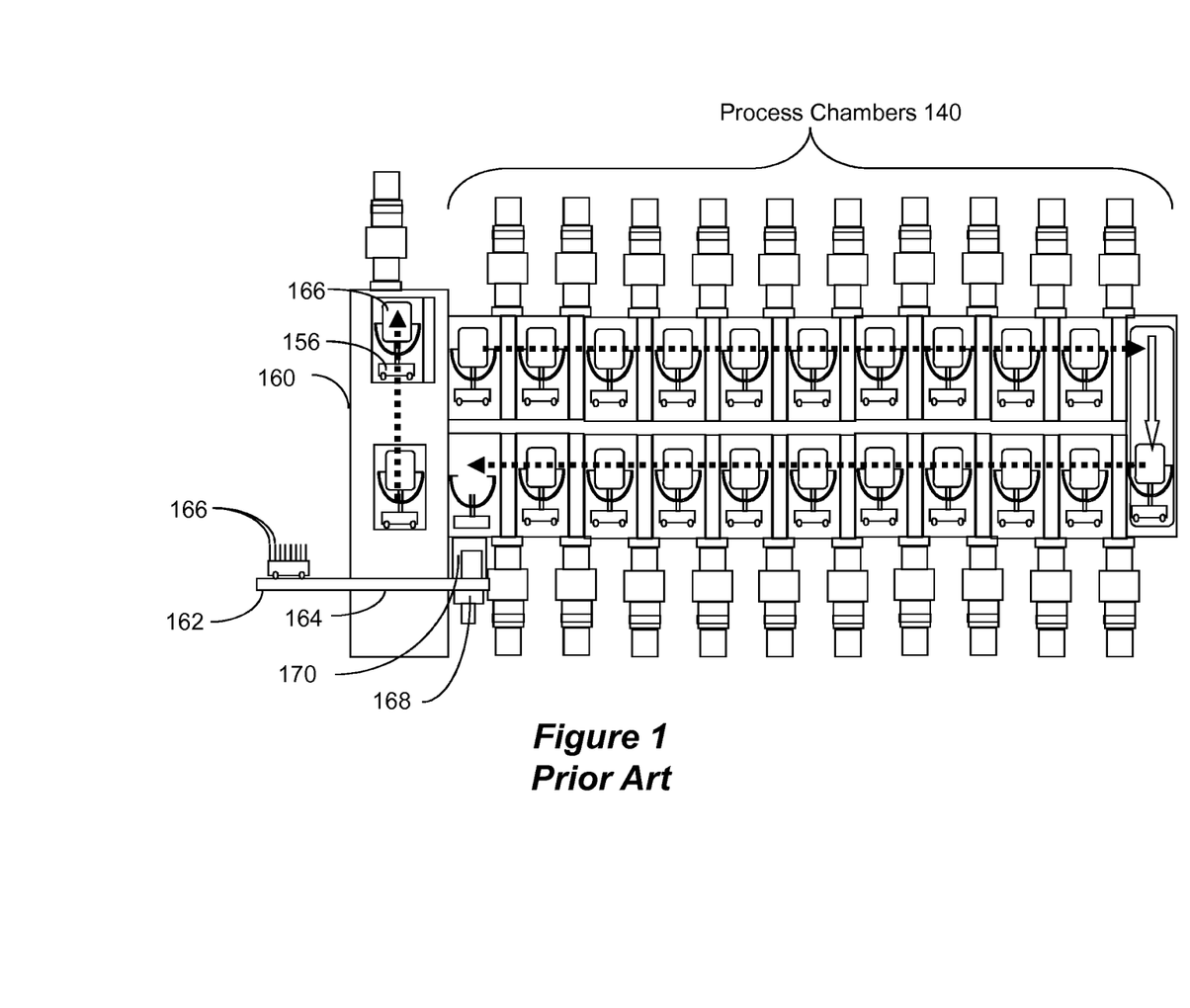
FIG. 1 illustrates a system according to the prior art.

FIG. 1 illustrates a prior art system that includes tracks 164 for transporting cassettes 162 containing a given number of substrates 166. The tracks 164 are maintained in a clean atmospheric environment, and leads to loading chamber 170, which is maintain in vacuum. Once cassette 162 enters the vacuum environment of loading chamber 170, a knife blade 168 removes substrates 166, one by one, from the cassette 162 and transfers them into a loading module, which loads each substrate 166 onto a single substrate carrier 156. In an alternative embodiment the carriers are double substrate carriers, in which case the loading module loads two substrates at a time. Thereafter the carrier 156 and substrate 166 are moved into elevator 160 and raised to the second level to begin traversing the plurality of processing chambers 140, each of which operating in vacuum environment and is isolated from other processing chambers during processing. The motion of the carrier 156 is shown by the arrows. Once processing is completed, the substrate 166 is removed from the carrier 156 and is placed in the cassette 162 by knife blade 168. The cassette then exists from the other side of loading chamber 170 on a second set of tracks. An example of such a system is disclosed in U.S. Pat. No. 6,919,001, which is commercially available under the trademark 200 Lean® for fabrication of, e.g., hard disk used in hard disk drives.

Another system for disk fabrication brings the cassettes into a vacuum environment. In such system, a front end module is maintained in vacuum, and a loadlock permits transporting a cassette carrying, e.g., 25 substrates into the vacuum environment. A secondary vacuum chamber may be provided, wherein a buffer station supporting the 25 substrates is stationed between two robots. The first robot transfer the 25 substrates from the cassette to the buffer station, and a second robot transfers the substrates onto carriers. The carriers may be single or double substrate carriers. As can be understood, having the cassettes travel into a vacuum environment necessitates a rather large gate valve and either a large pump or long pumping period, which slows the system. Also, since the cassette travels over tracks, particles may be generated, which may be brought into the vacuum environment when the cassette travels into the vacuum chamber. Such particles can introduce unwanted defects. Also, since the cassettes travel in atmospheric environment, the cassettes and substrates tend to absorb a lot of water vapor, which then is brought into the vacuum environment and needs to be pumped out. This is especially true for cassettes made of plastic material. Moreover, the secondary chamber housing the two robots and the buffer station must be constructed to be rather large, which requires long pumping time to maintain vacuum environment. An example of such a system is illustrated in U.S. Pat. No. 6,319,373.

Figure 2:
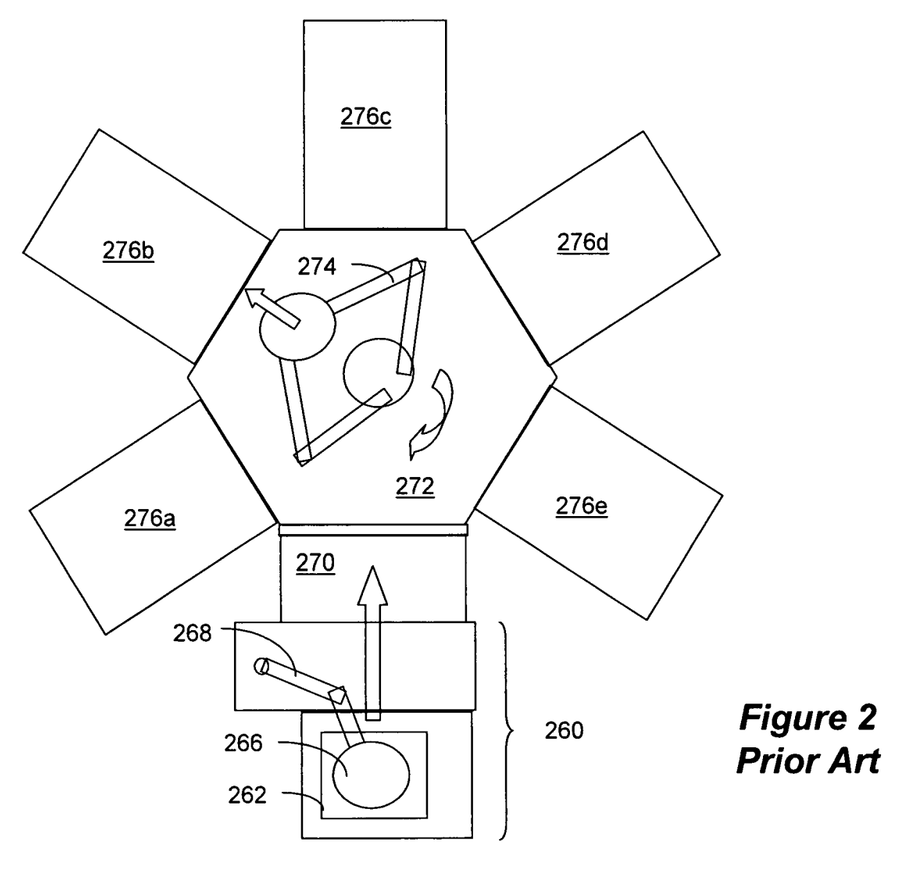
FIG. 2 illustrates another system according to the prior art.

FIG. 2 illustrates a prior art system wherein a front end system 260 includes provisions for supporting cassette 262 containing a plurality of substrates 266. The front end 260 maintains therein a clean atmospheric environment. A robotic arm 268 removes substrates 266, one by one, from the cassette 262 and transfers them into a loadlock 270. Mainframe system 272 maintains therein a vacuum environment and includes therein a transfer robot arm 274, operating in the vacuum environment. The robot arm 274 removes substrates 266, one by one, from loadlock 270 and transfer each substrate 266 to one of processing chambers 276a-276e. Notably, substrates 266 cannot be transferred from one of processing chambers 276 to another one, without first going through main frame 272, which drastically slows processing throughput in such architecture. Once processing is completed, the substrate 166 is removed from the processing chamber by the arm 274 and is placed in the loadlock 270, to be removed by robot arm 268 and placed in the cassette 262. Several examples of such an architecture are disclosed in U.S. Pat. No. 5,844,195, which also discloses systems transporting two wafers in tandem.

The prior art systems suffer from the problem of synchronizing transport time, vacuum pumping time, and process time. That is, when a substrate is moved from atmospheric condition into vacuum condition, a loadlock or transfer chamber is used together with a vacuum pump to evacuate the air entering the chamber during the transfer of the substrate. However, transporting the substrate and pumping the chamber into a vacuum environment may take considerable time, such that it slows the throughput of the entire system.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

The subject invention aims to solve the problems present in the prior art. According to aspects of the invention, introduction of substrates into vacuum environment is accomplish by gradually reducing the number of substrates being transferred simultaneously as the clean and evacuated environment is progressed. In embodiments of the invention the cassettes are maintained in clean atmospheric environment and do not enter the vacuum environment. Several vacuum locks are linearly staggered so as to introduce progressively higher level of vacuum environment. The number of substrates transported through this arrangement is a fraction or a portion of the number of substrates present in each cassette. The staggered vacuum locks lead to a series of processing chambers, wherein a yet smaller number of substrates, e.g., one or two, are transported.

According to one aspect of the invention, conventional cassettes are used to transfer plurality of substrates in an atmospheric environment. Multiple-substrate carriers are used to each move a fraction or a subset of the substrates, e.g., five or six substrates, from the cassettes in an atmospheric environment into vacuum environment. Then, single or dual-substrate carriers are used to each transfer one or two substrates among the processing chambers. Once processing is completed, the reverse process takes place, i.e., multiple-substrate carriers are used to move fraction/subsets of substrates from vacuum to atmospheric environment, and then several subsets are placed together into one cassette. The use of multiple-substrate carriers to transfer a reduced number of substrates at once from atmospheric to vacuum environment allows for constructing a relatively small vacuum lock chambers, which allows for relatively slow vent and pump of the vacuum locks since the space needed to be evacuated is rather small. Additionally, it allows for the use of relatively slow actuating load lock valves, which reduces particles and increases meantime between failures and meantime between services. Moreover, since the multi-substrate carriers spend a relatively short time in atmospheric environment, they have little time to absorb water vapor, so that the amount of vapor entering the loadlock system in each cycle is very small and can be easily pumped out.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 3:
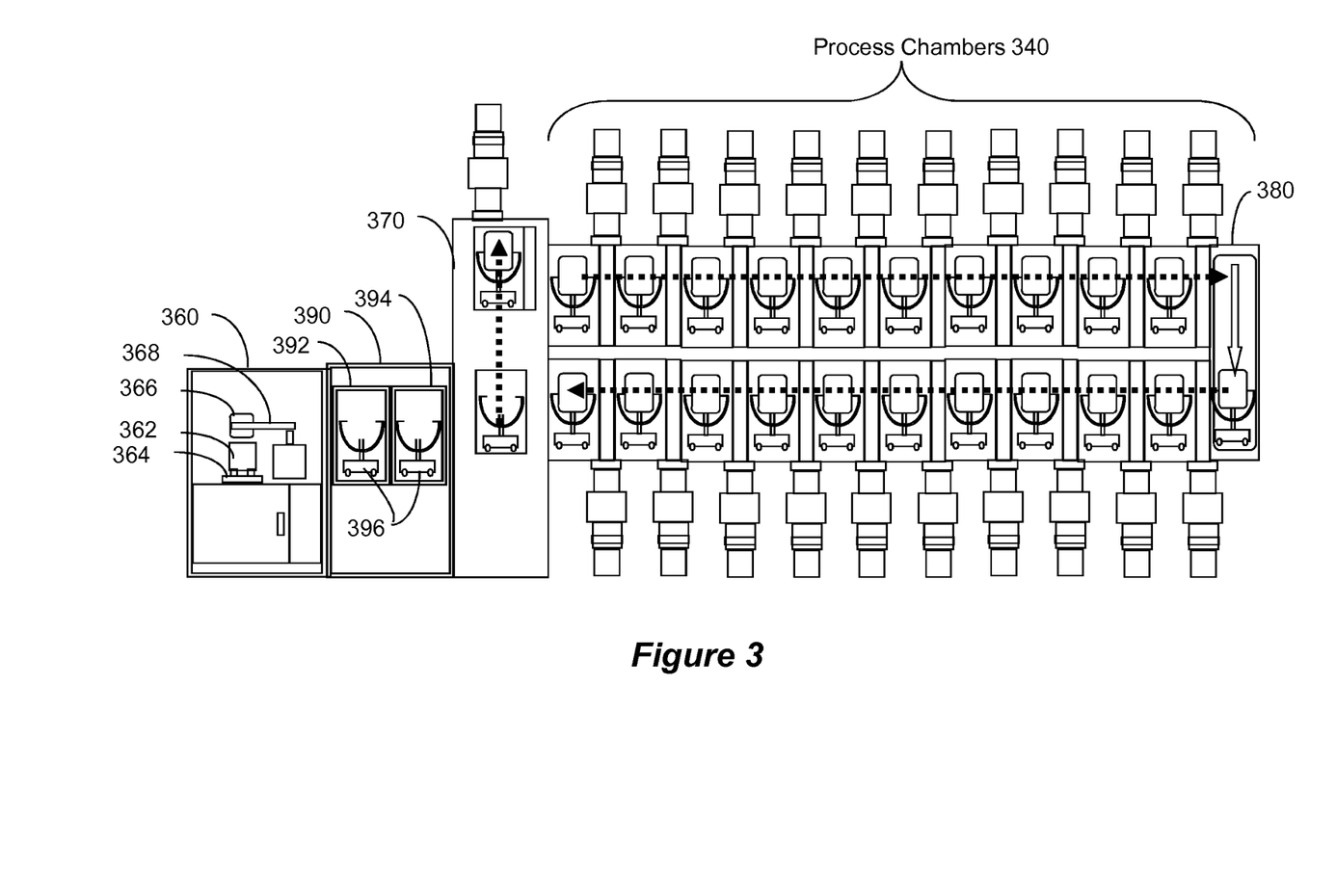
FIG. 3 is a simplified schematic illustrating a processing system in accordance with an embodiment of the invention.

A detailed description will now be given of embodiments of the invention for introducing substrates into vacuum environment of a substrate processing system. FIG. 3 is a simplified schematic illustrating a processing system in accordance with an embodiment of the invention. The system of FIG. 3 includes a plurality of processing chambers 340 arranged linearly and stacked one row above the other. A carrier elevator 380 is provided at the end of the stacked processing chambers. At the front of the stacked chambers are front end module 360 and substrate loading module 370. Front end module 360 has tracks 364 upon which cassettes 362 are transported in atmospheric environment, so as to deliver substrates 366 to the system. However, unlike the prior art system of FIG. 1, this embodiment further includes buffer module 390. Buffer module 390 includes a series of vacuum locks—here only two are shown, i.e., 392 and 394, but the number of vacuum locks can be changes as necessary. Multi-substrate carriers 396 transport substrates within the vacuum locks and between the vacuum locks and the atmospheric environment of front end unit 360.

In operation, each of cassettes 362 transports a plurality of substrates 366, e.g., 25 substrates per cassette, to and from the front end unit 360. At each cycle, robot arm 368 transfers a subset of the substrates 366 from the cassette 362 onto one of the multi-substrate carriers 396. For example, each of the multi-substrate carriers may carry only four, five or six substrates. The multi-substrate carrier 396 then transports the subset of substrates through the vacuum locks, 392, 394, so as to introduce the substrates into a vacuum environment. In this embodiment, each successive vacuum lock 392, 394, introduces a higher vacuum environment, so that the substrates go from atmospheric environment to high vacuum environment in gradual steps. Vacuum locks 392, 394, may include vapor removal system, such as Meissner trap, etc.

The carrier then moves into the substrate loading station 370, where each substrate is loaded individually onto a single-substrate carrier. Thence, the carrier transports the substrate for processing in the top row of processing chambers 340, moves to the lower row via elevator 380, and then traverses the lower row of processing stations 340. The carrier then moves back into the loading station 370, wherein the substrate is removed from the carrier and is placed, together with several other substrates in a multi-substrate carrier 396. The multi-substrate carrier 396 is then moved through another series of vacuum locks so as to remove the substrates from vacuum environment and into an atmospheric environment of the front end unit 360. At the front end the robot arm 368 unloads the substrates from the multiple-substrate carrier and into the cassette.

Figure 4:
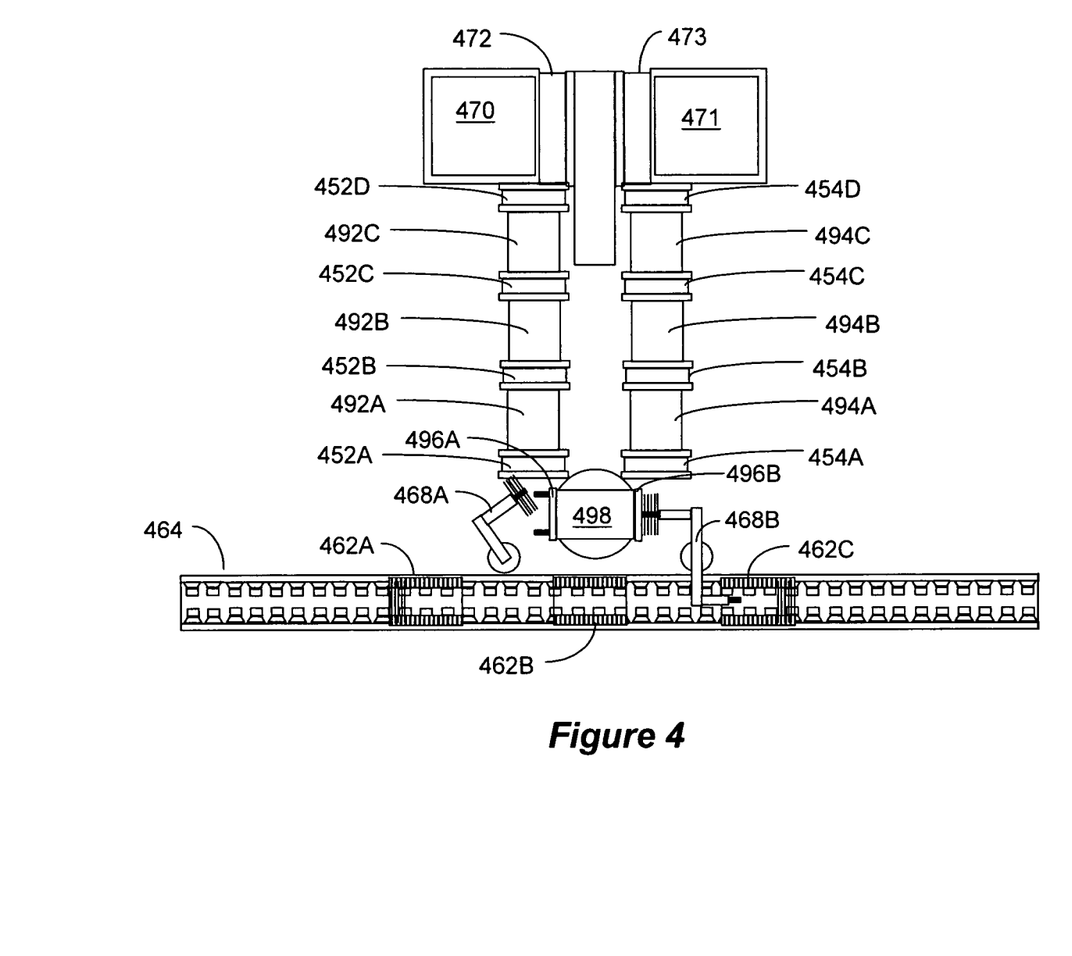
FIG. 4 is a top view of the front end module and the buffer module according to an embodiment of the invention.

FIG. 4 is a top view of the front end module and the buffer module according to an embodiment of the invention. Cassettes 462A-C travel on conveyor 464 in a clean atmospheric environment. Loading arm 468A removes a subset of the substrates that are in approaching cassette 462A. For example, approaching cassette 462A may hold 25 substrates, while loading arm 468A may remove a subset of the 25 substrates, e.g., only 3, 4, 5, etc. An empty multi-substrate transport carrier 496A, stationed on turn table 498, accepts the subset of substrates from loading arm 468A. Then the now loaded multi-substrates transport carrier 496A enters the first of vacuum locks 492A, passing gate 452A. In this embodiment, three loading vacuum locks, 492A-C, are utilized, so as to form a graduated vacuum lock system. Each or any of vacuum locks 492A-C may include vapor removal system, such as Meissner trap, etc. Also, in this embodiment each of the vacuum locks 492A-C includes a linear motor therein, so as to transport the multi-substrate carrier 496. Also, gate valves 452A-D are provided to isolate the vacuum lock from the environment and from each other.

Once the carrier exits vacuum lock 492C, it enters loading station 470. In load station 470 the substrates are removed from the multi-substrates carrier 496A and loaded onto a waiting station 472, which has the same capacity as multi-substrates carrier 496A. Carrier 496A is then moved to unload station 471, in which processed substrates have been placed onto a waiting station 473. The processed substrates from waiting station 473 are then loaded onto the empty carrier 496A, upon which the carrier starts traversing the unloading vacuum locks 494C-A, so as to gradually in a step-wise fashion introduce the processed substrates into an atmospheric environment. The carrier then exits the vacuum lock 494A onto the turntable 498, which is designated as carrier 496B in FIG. 4. An unloading arm 468B then transfers the group of wafers, all at once, onto the cassette 462C. The turn table 498 then rotates so as to place the now empty carrier 496B in the loading position (496A) to receive fresh substrates from the cassette 462A. Also, gate valves 454A-D are provided to isolate the vacuum lock from the environment and from each other.

Meanwhile, the substrates from the waiting station 472 are loaded, one by one, onto single-substrate process carriers at loading station 470. It should be noted that while a single-substrate process carrier is shown in FIG. 4, a dual-substrate carrier may also be used. However, the number of substrates that can be loaded onto the process carrier is less that that which can be loaded onto the transport carrier. Each process carrier transports its substrate through all of the processing stations and then exits into unload station 471, wherein the substrate is unloaded from the process carrier and placed onto the multiple-substrate waiting station 473.

Figure 5:
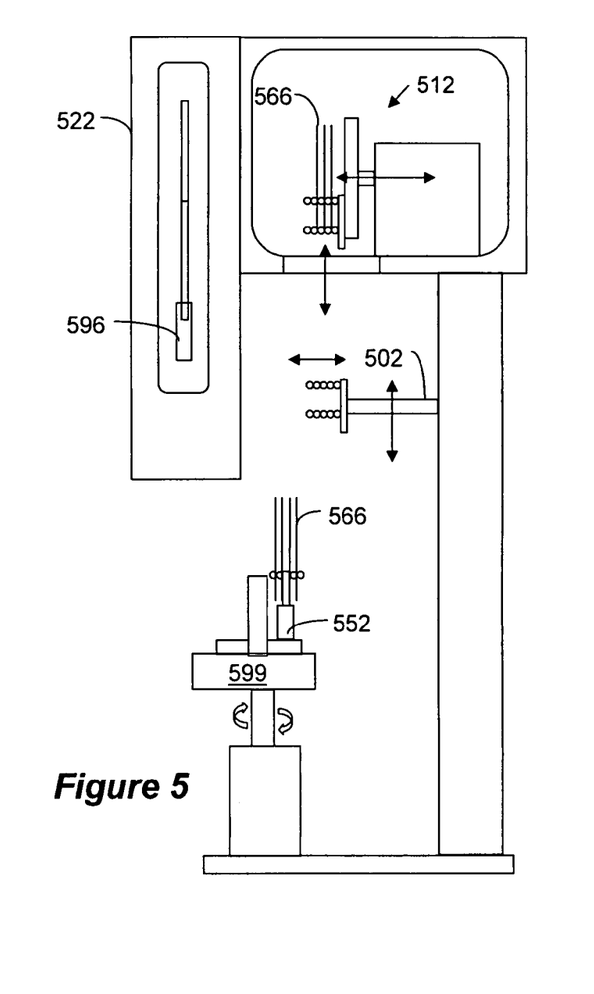
FIG. 5 illustrates an embodiment of a loading station.

FIG. 5 illustrates an embodiment of a loading station, such as the loading station 470 of FIG. 4. Multi-substrate transport carrier 552 is shown positioned on turn table 599 and holding four substrates 566. An elevator 502 travels down for removing the substrates 566 from the carrier 552, and then moves up to deliver these substrates to preload mechanism 512 (here shown holding three substrates for illustration purposes, but in operation when the elevator 502 delivers substrates to the preload 512, the preload 512 is empty). Preload mechanism 512 transfers substrates, one by one, onto single-substrate process carrier 596, positioned in loading chamber 522. It should be appreciated that the processing system may include a mirror unloading station that is constructed and operates the same as loading station shown in FIG. 5, except that the preload mechanism 512 removes processed substrates from single-substrate process carrier 596. When preload mechanism 512 collected sufficient number of substrates, the elevator 502 removes these substrates and load them onto a multiple-substrate transport carrier 552.

Figure 6:
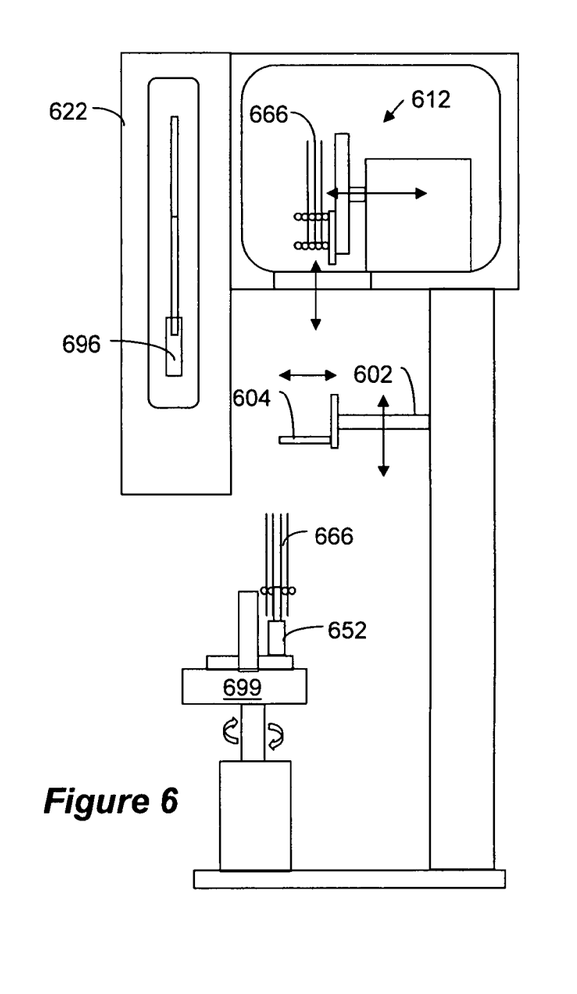
FIG. 6 illustrates another embodiment of a loading station.

FIG. 6 illustrates another embodiment of the loading station. This embodiment is similar to that of FIG. 5, except that elevator 602 does not remove substrates from carrier 652 (shown positioned on turn table 699 and holding four substrates 666). Instead, carrier 652 is made of two parts: a base having the wheels and motive elements, and a removable part which supports the substrates. The elevator 602 includes a fork mechanism 604 structured to engage and remove the removable part of carrier 652 and carry it up to the preload mechanism, wherein the substrates are transferred to the preload mechanism; after which the elevator lowers the removable part back to its seat on the base. Preload mechanism 612 transfers substrates 666, one by one, onto single-substrate process carrier 696, positioned in loading chamber 622.

Figures 7, 8, 9:
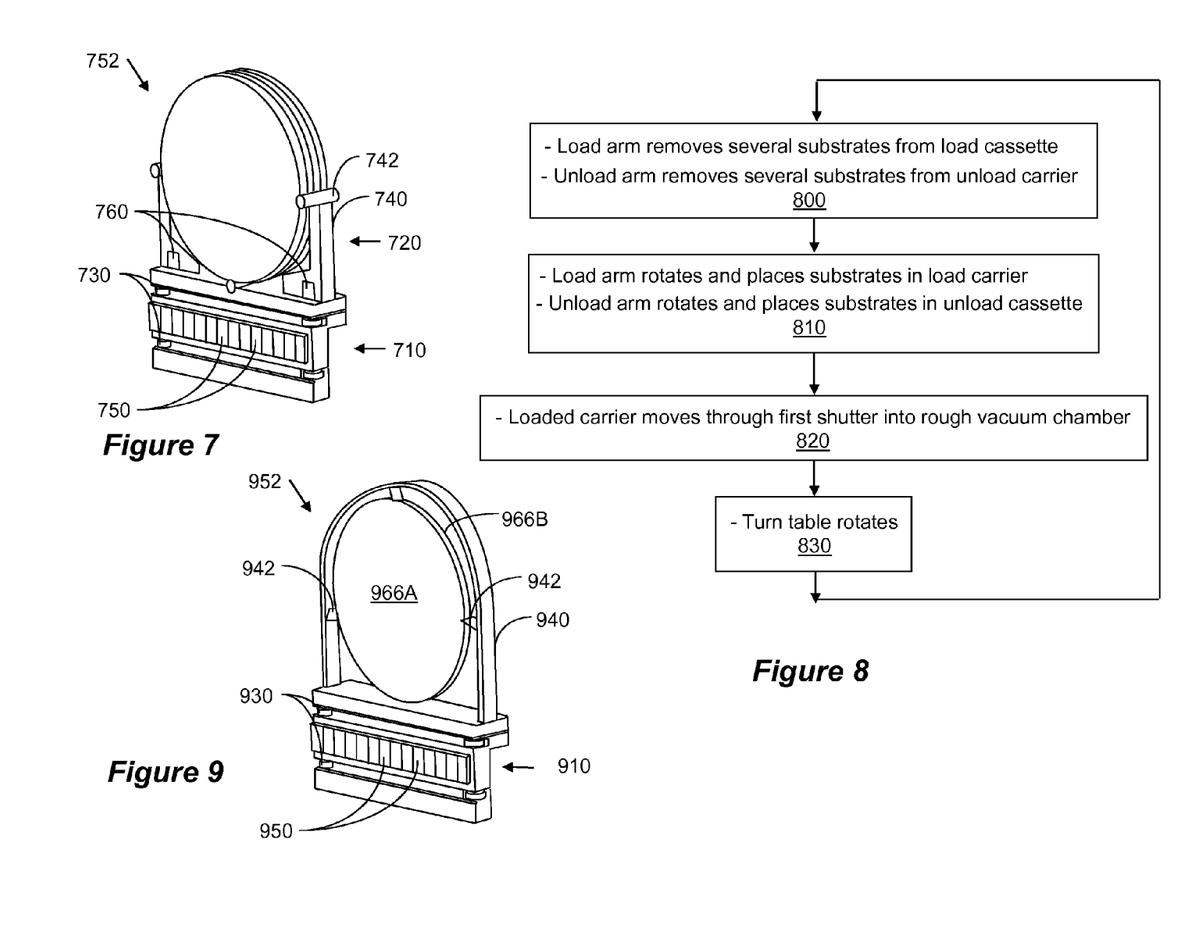
FIG. 7 illustrates a multi-substrate carrier according to an embodiment of the invention.
FIG. 8 is a flow chart of a loading process according to an embodiment of the invention.
FIG. 9 illustrates a process carrier that can be used in the system of FIG. 3 for simultaneously processing two substrates.

FIG. 7 illustrates a multi-substrate transport carrier according to an embodiment of the invention. This embodiment can be beneficially utilized in the loading station of either FIGS. 5 and 6, but is most suitable for the embodiment of FIG. 6. The multi-substrate transport carrier 752 is composed of a base 710 and a removable substrate support part 720. The substrate support part 720 can be attached to the transport part 710 using mechanical means, e.g., clips, or by magnets. Alignment pins (obscured in FIG. 7) can be used to ensure consistent alignment of the substrate support part 720 on base 710. Base 710 has wheels 730 which ride on tracks positioned in the various chambers and turntables. To avoid slippage the wheels may be magnetized. Base 710 also includes motive means. In this embodiment, the motive means is a linear motor, for which magnets 750 are placed on the base 710, while the remaining parts of the linear motor are placed in the various chambers and turn tables, together with the tracks. The substrate support part 720 includes support arms 740 having support cylinders 742 attached at the end thereof. The support cylinders 742 may be formed by making grooves in cylinders made of DuPont® Vespel® to avoid particles contamination. A third support cylinder can be positioned at the bottom of the support part 720. The support part 720 may also include holes 760 for engaging the lift fork 604. Further, for stability, magnetic forces can be used to hold the detachable substrate support part 720 on the lift fork 604. That is, the magnets used to stabilize the support part 720 over the base 710 may also be used to stabilize the support part 720 on the lift fork 604. Alternatively, magnets can be included on the lift fork 604, in which case ferromagnetic material should be included on the support part 720.

FIG. 8 is a flow chart of a loading process according to an embodiment of the invention. At step 800 a loading arm removes several substrates from a load cassette. For example, load cassette may have 25 fresh substrates and load arm may remove five of them. The unload arm removes the substrates from a multi-substrate carrier having processed substrates thereon. At step 810 load arm rotates and places its substrates in the empty load carrier. The unload arm rotates and places the processed substrates in the unload cassette. At step 820 the loaded carrier moves through the first shutter and into the first rough vacuum chamber. From here, independently of the process of this flow chart, the carrier will progress through the series of vacuum locks until it reaches the turn table on the other side of the system and its wafers will be unloaded, upon which it will traverse the vacuum chambers in the other direction to return as an empty carrier. Meanwhile, at step 830 the turn table rotates so as to place the now empty carrier in a loading position. The process then repeats itself.

In the system of FIG. 3 the process carrier is illustrated as carrying a single substrate which may be processed on both sides. For example, when the system is used for fabricating disks for hard disk drives, processing is performed on both sides of the disk, since both faces of the disk are used for data storage. On the other hand, the system may be used for processing other substrates, e.g., solar cells. In such a case, the substrate needs to be processed only on one side thereof. FIG. 9 illustrates a process carrier that can be used in the system of FIG. 3 for simultaneously processing two substrates, each on one side thereof, such that the throughput of the system can be doubled.

FIG. 9 illustrates a process carrier, which may be similar to that shown in FIG. 4A of the above-noted U.S. Pat. No. 6,919,001. The carrier 952 has a base 910 having wheels 930 and magnets 950. The substrates are supported by arc 940, which has clips 942 to hold the substrates at the periphery only. In this manner, the entire surface of the substrate is exposed for processing. As illustrated in FIG. 9, two substrates, 966A and 966B are held by clips 942, facing back to back. In this manner, when the carrier enters a processing chamber, the front surfaces of both substrate are processed simultaneously.

Figure 10:
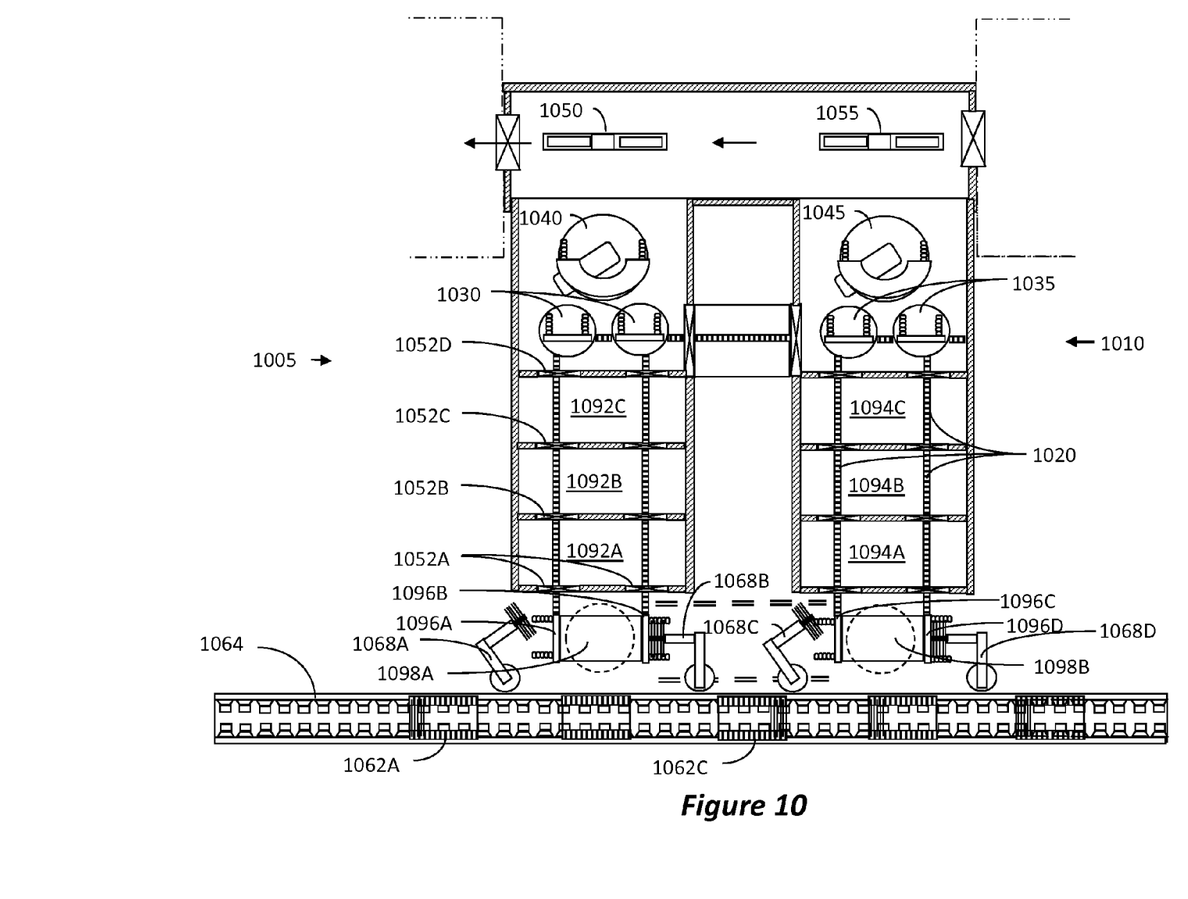
FIG. 10 illustrates another embodiment of a system according to an embodiment of the invention.

FIG. 10 illustrates another embodiment of a system according to an embodiment of the invention, which enables simultaneous processing of two substrates, each on both surfaces.

Alternatively, it can be used to process fours substrates simultaneously, each on one surface only, by supporting the substrates back to back, as in the embodiment of FIG. 9. In FIG. 10 the processing system itself is only suggested by phantom lines, as it is identical to that disclosed in the above noted U.S. Pat. No. 6,319,373. On the other hand, the front loading part is implemented according to an embodiment of the invention, wherein the number of substrates being transported is reduced, as the level of vacuum is increased.

As illustrated in FIG. 10, a conveyor 1064 is used to transport cassettes in a clean atmospheric environment. The system has loading module 1005 and unloading module 1010, which are similar, but which operate in opposite direction to each other. The loading module 1005 has a three stage staggered vacuum lock, having three vacuum chambers 1092A-C and corresponding gates 1052A-D. Tracks and linear motors 1020 are provided in each vacuum chamber so as to enable transport of carriers 1096A-D. Carriers to be loaded, i.e., 1096A and 1096B are positioned on loading station 1098A, which may or may not include a turn table (shown in broken line), while carriers to be unloaded are positioned on unloading station 1098B, which also may or may not include a turn table.

Fresh substrates arriving on cassettes 1062A and 1062C are loaded onto transport carriers 1098A and 1098B by arms 1068A and 1068B. The number of substrates loaded is smaller than the total number of substrates held in each cassette. For example, each cassette may holds 25 substrates, and each transport carrier may hold five substrates. Once the transport carriers 1098A and 1098B are loaded, they are transported on the tracks 1020 so as to successively progress through the staggered vacuum locks until they reach loading turntables 1030. At turntable 1030 a robot arm 1040 removes one substrate from each transport carrier 1096A and 1096B and loads the two substrates onto a processing carrier 1050 in tandem, one behind the other. This loading of processing carriers is repeated until all of the substrates have been removed from the transport carriers 1096A and 1096B.

Once all of the substrates have been removed from transport carriers 1096A and 1096B, the carriers 1096A and 1096B are moved to unload turntables 1035. There, robot arm 1045 removes substrates from tandem-substrate carriers 1055, and places the substrates onto transport carriers 1096A and 1096B. Once transport carriers 1096A and 1096B are fully loaded, turntables 1035 rotate to align with the tracks 1020, so that carriers 1096A and 1096B be transported in successively reduced vacuum conditions in vacuum chambers 1094C-A until they emerge onto unloading station 1098B. At unload station 1098B arms 1068C and 1068D remove the substrates from the carriers 1096A and 1096B and place the substrates onto cassettes. Once the substrates have been removed from transport carriers 1096A and 1096B, the carriers can be removed from the system for cleaning or be transported to load station 1098A. To transfer the carrier from unload station 1098B to load station 1098A, the station may include a turntable and tracks with linear motors may be provided between the two stations, as shown in broken lines.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

The present invention has been described in relation to particular examples, which are intended in all respects to be illustrative rather than restrictive. Those skilled in the art will appreciate that many different combinations of will be suitable for practicing the present invention. Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A substrate processing system comprising:
   a front end module having tracks for transporting cassettes, each cassette holding a first preset number of substrates therein;
   a plurality of transport carriers;
   a staggered vacuum lock module, introducing progressively higher level of vacuum environment, coupled to the front end module and having tracks for transporting the plurality of transport carriers between atmospheric environment and vacuum environment through the progressively higher level of vacuum environment, each transport carrier supporting a second preset number of substrates, the second preset number being smaller than the first preset number;
   a plurality of processing chambers coupled to the vacuum lock module and having tracks for transporting processing carriers, each processing carrier supporting a third preset number of substrates, the third preset number being smaller than the second preset number.

2. The substrate processing system of claim 1, wherein the staggered vacuum lock module comprises a load module and an unload module.

3. The substrate processing system of claim 2, wherein the front end module further comprises a loading robot arm, an unloading robot arm, and a turntable positioned between the loading and unloading robot arms.

4. The substrate processing system of claim 3, further comprising a buffer station positioned between the staggered vacuum lock module and the plurality of processing chambers.

5. The substrate processing system of claim 4, wherein buffer station is maintained in vacuum and comprises a second turntable for transferring transport carriers from the load module to the unload module.

6. The substrate processing system of claim 5, wherein the buffer station further comprises an elevator for removing substrates from the transport carriers.

7. The substrate processing system of claim 6, wherein the transport carrier comprises a base and a removable substrate supporting part, and wherein the elevator is structured to engage and lift the substrate supporting part from the base.

8. The substrate processing system of claim 1, wherein each of the processing carriers is structured to support two substrates held back-to-back, such that only one surface of each substrate is exposed for processing.

9. The substrate processing system of claim 1, wherein each of the processing carriers is structured to support two substrates held in tandem, such that each substrate is exposed for processing.

10. The substrate processing system of claim 1, wherein the front end module is maintained at an atmospheric environment.

11. The substrate processing system of claim 1, wherein the first preset number is selected from 15 to 25; the second preset number is selected from 3 to 6; and the third preset number is selected from 1 to 4.

12. A substrate processing system comprising:
a plurality of processing carriers, each configured for supporting substrates and for riding on tracks;
a plurality of transport carriers, each configured for supporting substrates and for riding on tracks;
an array of a plurality of processing chambers, each chamber having tracks for transporting the processing carriers;
a buffer station coupled to the array and maintained under vacuum environment;
a loading vacuum lock module coupled to the buffer station and having tracks for transporting the transport carriers from an atmospheric environment into the buffer station;
an unloading vacuum lock module coupled to the buffer station and having tracks for transporting the transport carriers from the buffer station and out to an atmospheric environment;
a front end module having tracks for transporting cassettes in an atmospheric environment, wherein each cassette holding a preset number of substrates therein.

13. The substrate processing system of claim 12, further comprising a turntable positioned to receive the transport carriers from the unloading vacuum lock module and for transporting the transport carriers into the loading vacuum lock module.

14. The substrate processing system of claim 13, wherein the buffer station comprises a second turntable for transferring the transport carriers from the loading vacuum lock module to the unloading vacuum lock module.

15. The substrate processing system of claim 12, wherein the transport carriers are structured to support a number of substrates that is smaller than the number of substrates in the cassettes and wherein the processing carriers are structured to support a number of substrates that is smaller than the number of substrates in the transport carriers.

16. The substrate processing system of claim 12, further comprising a loading arm structured to remove substrates from the cassettes and place them onto the transport carriers; and an unloading arm structured to remove substrates from the transport carriers and place them into the cassettes.

17. The substrate processing system of claim 12, further comprising a transport mechanism structured to relay transport carriers between the loading vacuum lock module to the unloading vacuum lock module.

18. The substrate processing system of claim 12, wherein each of the loading vacuum lock module and unloading vacuum lock module comprises a plurality of vacuum modules linearly staggered so as to introduce progressively higher level of vacuum environment.

19. The substrate processing system of claim 12, wherein the buffer station further comprises a preload mechanism.

20. The substrate processing system of claim 19, wherein the buffer station further comprises an elevator transporting substrates between the loading vacuum lock module and the preload mechanism and between the preload mechanism and the unloading vacuum lock module.

* * * * *